(12) United States Patent
Ahn

(10) Patent No.: US 11,862,660 B2
(45) Date of Patent: Jan. 2, 2024

(54) PIXEL HAVING TWO SEMICONDUCTOR LAYERS, IMAGE SENSOR INCLUDING THE PIXEL, AND IMAGE PROCESSING SYSTEM INCLUDING THE IMAGE SENSOR

(71) Applicant: SAMSUNG ELECTRONICS CO., LTD., Suwon-si (KR)

(72) Inventor: Jung-Chak Ahn, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 179 days.

(21) Appl. No.: 17/340,273

(22) Filed: Jun. 7, 2021

(65) Prior Publication Data

US 2021/0296390 A1 Sep. 23, 2021

Related U.S. Application Data

(60) Continuation of application No. 16/560,347, filed on Sep. 4, 2019, now Pat. No. 11,152,419, which is a (Continued)

(30) Foreign Application Priority Data

Sep. 29, 2005 (KR) .................. 10-2005-0091293

(51) Int. Cl.
*H01L 27/146* (2006.01)

(52) U.S. Cl.
CPC .... *H01L 27/14643* (2013.01); *H01L 27/1464* (2013.01); *H01L 27/14612* (2013.01); *H01L 27/14634* (2013.01); *H01L 27/14636* (2013.01)

(58) Field of Classification Search
CPC .......... H01L 27/14601–14612; H01L 27/14634–14638
See application file for complete search history.

(56) References Cited

U.S. PATENT DOCUMENTS 5,168,379 A 12/1992 Mori et al.
6,967,364 B2 11/2005 Hong
(Continued)

FOREIGN PATENT DOCUMENTS

JP 59-010265 1/1984
JP 62-092365 4/1987
(Continued)

OTHER PUBLICATIONS

Office Action dated Jan. 8, 2021 in corresponding U.S. Appl. No. 16/560,347.
(Continued)

*Primary Examiner* — Laura M Menz
*Assistant Examiner* — Candice Chan
(74) *Attorney, Agent, or Firm* — F. Chau & Associates, LLC

(57) ABSTRACT

An image sensor having pixels that include two patterned semiconductor layers. The top patterned semiconductor layer contains the photoelectric elements of pixels having substantially 100% fill-factor. The bottom patterned semiconductor layer contains transistors for detecting, resetting, amplifying and transmitting signals charges received from the photoelectric elements. The top and bottom patterned semiconductor layers may be separated from each other by an interlayer insulating layer that may include metal interconnections for conducting signals between devices formed in the patterned semiconductor layers and from external devices.

20 Claims, 7 Drawing Sheets

Related U.S. Application Data continuation of application No. 16/285,686, filed on Feb. 26, 2019, now Pat. No. 11,094,732, which is a continuation of application No. 15/937,632, filed on Mar. 27, 2018, now Pat. No. 10,249,677, which is a continuation of application No. 15/047,444, filed on Feb. 18, 2016, now Pat. No. 9,954,025, which is a continuation of application No. 13/838,627, filed on Mar. 15, 2013, now Pat. No. 9,293,501, which is a continuation of application No. 12/684,163, filed on Jan. 8, 2010, now Pat. No. 8,508,012, which is a division of application No. 11/524,695, filed on Sep. 21, 2006, now Pat. No. 7,671,435.

(56) References Cited

U.S. PATENT DOCUMENTS

| | | |
|---|---|---|
| 7,205,623 B2 | 4/2007 | Hong et al. |
| 7,279,729 B2 | 10/2007 | Roy |
| 7,592,644 B2 | 9/2009 | Suzuki et al. |
| 7,671,435 B2 | 3/2010 | Ahn |
| 7,956,394 B2 | 6/2011 | Lee |
| 8,508,012 B2 | 8/2013 | Ahn |
| 9,293,501 B2 | 3/2016 | Ahn |
| 9,954,025 B2 | 4/2018 | Ahn |
| 10,249,677 B2 | 4/2019 | Ahn |
| 11,722,800 B2 * | 8/2023 | Iwabuchi ............ H01L 23/481 |
| 2003/0230771 A1 | 12/2003 | Lee |
| 2004/0251481 A1 | 12/2004 | Rhodes |
| 2005/0030399 A1 | 2/2005 | Suzuki et al. |
| 2007/0018075 A1 * | 1/2007 | Cazaux ............ H01L 27/14609 257/E27.131 |
| 2013/0207219 A1 | 8/2013 | Ahn |
| 2016/0163759 A1 | 6/2016 | Ahn |
| 2018/0219042 A1 | 8/2018 | Ahn |
| 2019/0198555 A1 | 6/2019 | Ahn |
| 2019/0393260 A1 | 12/2019 | Ahn |

FOREIGN PATENT DOCUMENTS

| | | |
|---|---|---|
| JP | 05-048825 | 2/1993 |
| JP | 2000-156488 | 5/2000 |
| JP | 2003-215255 | 7/2003 |
| KR | 10200400093908 | 11/2004 |
| KR | 1020050042729 | 5/2005 |
| KR | 2006-0108378 | 10/2006 |
| WO | 2006/109937 | 10/2006 |

OTHER PUBLICATIONS

Office Action dated Apr. 6, 2020 in corresponding U.S. Appl. No. 16/285,686.

Final Office Action dated Oct. 29, 2020 in corresponding U.S. Appl. No. 16/285,686.

* cited by examiner

PIXEL HAVING TWO SEMICONDUCTOR LAYERS, IMAGE SENSOR INCLUDING THE PIXEL, AND IMAGE PROCESSING SYSTEM INCLUDING THE IMAGE SENSOR

CROSS-REFERENCE TO RELATED APPLICATIONS

This application is a continuation of U.S. application Ser. No. 16/560,347 filed Sep. 4, 2019, which is a continuation of U.S. application Ser. No. 16/285,686 filed Feb. 26, 2019, which is a continuation of U.S. application Ser. No. 15/937,632 filed on Mar. 27, 2018, issued as U.S. Pat. No. 10,249,677 on Apr. 2, 2019, which is a continuation of U.S. application Ser. No. 15/047,444 filed on Feb. 18, 2016, issued as U.S. Pat. No. 9,954,025 on Apr. 24, 2018, which is a continuation of U.S. application Ser. No. 13/838,627 filed on Mar. 15, 2013, issued as U.S. Pat. No. 9,293,501 on Mar. 22, 2016, which is a continuation of U.S. application Ser. No. 12/684,163 filed on Jan. 8, 2010, issued as U.S. Pat. No. 8,508,012 on Aug. 13, 2013, which is a divisional of U.S. application Ser. No. 11/524,695 filed on Sep. 21, 2006, issued as U.S. Pat. No. 7,671,435 on Mar. 2, 2010, which claims priority under 35 U.S.C. § 119 of Korean Patent Application 10-2005-0091293 filed on Sep. 29, 2005, the disclosures of which are incorporated by reference herein in their entireties.

BACKGROUND

The present invention relates to image sensors, and more particularly to pixels of image sensors.

Digital cameras are today one of the most popular consumer electronics. The "MegaPixel" capacity and color sensitivity of image sensors is currently a limiting factor limiting image quality of images captured by digital cameras. Image sensors function to transform (visible) light that is focused onto the image sensor by optical lenses, into electrical signals to capture and display images of high quality. Additionally, a very fast "shutter speed" or "film speed" equivalent in digital image sensors is a strong selling point for high-end digital cameras and can enhance image quality (e.g., reducing blurring due to subject or camera motion).

A typical image sensor comprises a pixel array that has a plurality (array) of pixels. Each pixel includes a photodiode for generating signal charges in response to photons (i.e., light) incident thereon, and an electronic element for transferring and outputting the signal charges from the photodiode. Depending upon the manner of transferring and outputting signals charges, image sensors are roughly classified into two kinds, i.e., charge-coupled devices (CCD; hereinafter, 'CCD image sensors') and complementary metal-oxide-semiconductor (CMOS) image sensor (hereinafter, 'CMOS image sensor'). The CCD image sensor uses pluralities of MOS capacitors for accumulating, transferring and outputting charges. By applying appropriate voltages to the electrodes of the MOS capacitors, signal charges of each pixel are successively transferred by way of the MOS capacitors. The CMOS image sensor uses pluralities of transistors, by which signal charges generated by the photodiode are converted into a voltage at each pixel and output therefrom.

The CCD image sensors typically have better noise and image quality than CMOS image sensors, but CMOS image sensors typically have lower product cost and lower power consumption than CCD image sensors. In other words, the CMOS image sensor has the advantages of lower power, singularity of voltage and current, compatibility with combined CMOS circuits (e.g., integrated on the same chip), random access of image data, and lower production cost by employing the standard of CMOS technology. Thus, CMOS image sensors are gaining market share in various applications such as digital cameras, smart phones, personal digital assistants (PDA), notebook computers, security cameras, barcode detectors, high-definition television sets, children's toys, and so on.

FIG. 1 is a plane view of a portion of a pixel array of a conventional image sensor. Referring to FIG. 1, pixels are formed around active regions 13 of a semiconductor substrate, the active regions being electrically isolated from each other (like "semiconductor islands"), each of which includes a photodiode and pluralities of transistors. Each active region 13 may be sectored into a first active region 13A including the photodiode, and a second active region 13B including the plural transistors. On the second active region 13B are arranged a transfer gate 21, a reset gate 23, a source follower gate 25, and a selection gate 27. The transfer gate 21 is located adjacent to the first active region 13A. An impurity region formed in the second active region 13A between the transfer and reset gates 21 and 23 serves as a floating diffusion region 29 that is electrically connected to the source follower gate 25. An impurity region formed in the second active region 13B between the reset and source follower gates 23 and 25 acts as a reset diffusion region 31. There is an impurity region 33 in the second active region 13B between the source follower and selection gates 25 and 27, and an impurity region 35 in the second active region 13B outside of the selection gate 27. Each transistor is formed of a gate and the impurity regions at either side of its gate.

The vertically sectional structure of a representative pixel is next described with reference to FIG. 2. FIG. 2 is a cross-sectional view of one pixel taken along section line I-I' of FIG. 1. Referring to FIG. 2, the photodiode includes an N-type region 17 and a P-type region 19 formed in the first active region 13A. The floating diffusion (FD) region 29 is electrically connected to the source follower gate 25 through a local interconnection 37.

In the general structure of a conventional pixel, it is necessary to form the photodiode and gates in the same active region 13 and to allocate a part (e.g., 13B) thereof to the transistors. Thus, only a portion, i.e., the first active region 13A of the active region 13 is used for the photodiode. Thus, there is a limitation of the conventional image sensor due to a fill factor that represents the area occupied in a pixel by the photodiode.

The "fill factor" indicates the size of the light sensitive photodiode relative to the entire pixel and is the fraction of the surface that is sensitive to light. A large fill factor is desirable because the larger the fill factor the more light will be captured by the chip up to the maximum of 100%. This helps improve the Signal-to-Noise Ration (SNR). Because of the extra electronics (e.g., transistors) required in each pixel the "fill factor" tends to be quite small, especially for Active Pixel Sensors which have more per pixel transistors. To overcome this limitation, some have proposed an array of microlenses to be placed on top of the sensors, but this increases the production cost. Additionally, in the conventional image sensor, light incident upon a target pixel, especially, light incident from a slanted angle, may be reflected by an interconnection of the target pixel or a gate and may arrive at an adjacent pixel, causing across-talk affect or distortion.

SUMMARY OF THE INVENTION

Various embodiments of the invention provide image sensors having pixels that include two patterned semiconductor layers. The top (second) patterned semiconductor layer contains the photoelectric elements (e.g., photodiodes) of pixels having substantially 100% fill-factor, and may contain one or more transistors. The bottom (first) patterned semiconductor layer contains transistors for detecting, resetting, amplifying and transmitting signals charges received from the photoelectric elements. The top and bottom patterned semiconductor layers may be separated from each other by an interlayer insulating layer that may include metal interconnections for conducting signals between devices formed in the patterned semiconductor layers and from external devices.

Exemplary embodiments of the invention provide a pixel with improved architecture, an image sensor having the pixel, and an image processing system employing the image sensor.

Some embodiments of the invention provide an image sensor comprising: first and second semiconductor patterns (i.e., first and second patterned semiconductor layers) with an interlayer insulating layer interposed therebetween; a photoelectric element formed in the second semiconductor pattern; and at least one or more transistors formed in the first semiconductor pattern, electrically connected to the photoelectric element and sensing signal charges generated from the photoelectric element.

The photoelectric element may be a photodiode comprising: an N-type region formed in the second semiconductor pattern; and a P-type region formed in the second semiconductor pattern enveloping the N-type region.

The image sensor may further comprise first and second charge collection regions (electrically connected to each other) formed in the first and second semiconductor patterns respectively for collecting the signal charges generated in the photoelectric element. The one or more transistors may be operationally coupled with the first and second charge collection regions. The one or more transistors may comprise a first transistor for sensing and a second transistor for resetting signal charges, of the first and second charge collection regions. The first and second transistors are connected with each other by a common drain. A gate of the first transistor is electrically connected to the first and second charge collection regions. The first charge collection region acts as a source of the second transistor.

The image sensor may further comprise a transfer gate in the second semiconductor pattern (e.g., beneath the photodiode) for transferring the signal charges to the first and second charge collection region from the photoelectric element.

The photoelectric element may be a diode comprising: an N-type region formed in the second semiconductor pattern; and a P-type region, formed in the second semiconductor pattern, enveloping the N-type region. The second charge collection region may be formed in the P-type region outside of the transfer gate, being spaced apart (separated) from the N-type region.

The image sensor may further comprise a color filter formed on (e.g., directly on) the second semiconductor pattern. The photoelectric element may directly contact the second semiconductor pattern. The photoelectric element may interpose a buffer layer with the color filter.

Other embodiments of the present invention provide an image sensor comprising: first and second semiconductor patterns (i.e., first and second patterned semiconductor layers) with an interlayer insulating layer interposed therebetween; a photoelectric element (e.g., photodiode) in the second semiconductor pattern; a transfer gate below the photoelectric element in the second semiconductor pattern for transferring signal charges from the photoelectric element to a second charge collection region in the second semiconductor pattern; a first charge collection region in the first semiconductor pattern and electrically connected to the second charge collection region; a source follower gate in the first semiconductor pattern and electrically connected to the first and second charge collection regions; first source and drain regions in the first semiconductor pattern at either side of the source follower gate; and a reset gate in the first semiconductor pattern between the first drain region and the first charge collection region.

The photoelectric element may be a diode comprising: an N-type region formed in the second semiconductor pattern; and a P-type region formed in the second semiconductor pattern so as to envelop the N-type region. The first charge collection region is formed in the second semiconductor pattern outside of the transfer gate and spaced apart from the N-type region.

The interlayer insulating layer may comprise first and second interlayer insulating layers. The first charge collection region is electrically connected to the second charge collection region by: a first contact plug penetrating the first interlayer insulating layer and electrically connected to the second charge collection region; a local conductive pattern formed on the first interlayer insulating layer and electrically connected to the first contact plug; and a second contact plug penetrating the second interlayer insulating layer and electrically connecting the first charge collection region with the local conductive pattern.

The local conductive pattern is electrically connected with a third contact plug that penetrates the first interlayer insulating layer and is electrically connected to the source follower gate.

The interlayer insulating layer may include metal interconnections for applying bias voltages to the transfer and reset gates.

The image sensor may further comprise: a second drain region formed in the first semiconductor pattern; and a selection gate formed in the first semiconductor pattern between the second drain region and the first source region. The interlayer insulating layer may include a metal interconnection for applying a bias voltage to the selection gate.

Further other embodiments of the present invention provide an image sensor comprising pixels: each pixel includes a photoelectric element formed in a second semiconductor pattern (i.e., in a first patterned semiconductor layer); and at least one or more transistors formed in a first semiconductor pattern (i.e., in a second patterned semiconductor layer) and operationally coupled to the photoelectric element, the first semiconductor pattern being spaced apart from (separated from) or electrically insulated from the second semiconductor pattern.

Still further embodiments of the present invention provide an image processing system comprising: a processor; and an image sensor operationally coupled with the processor. The image sensor comprises a plurality of pixels. Each pixel comprises: a photoelectric element formed in a second semiconductor pattern (i.e., in a second patterned semiconductor layer); and at least one or more transistors formed in a first semiconductor pattern (i.e., in a first patterned semiconductor layer) and operationally coupled to the photoelectric element, the first semiconductor being spaced apart from (separated from) or electrically insulated from the second semiconductor.

A further understanding of the nature and advantages of the invention herein may be realized by reference to the remaining portions of the specification and the attached drawings.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the size of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout. It will be understood that, although the terms for first, second, third, etc. may be used herein to describe various elements such as region, film, layer, etc., these elements should not be limited by these terms. These terms are only used to distinguish one element from another. For example, a first layer could be termed a second layer, and, similarly, a second layer could be termed a first layer without depart from the teaching of the disclosure.

In this description, for example, a sentence 'first element is operationally coupled with second element' means that a specific terminal or node of the first element is connected to a specific terminal or node of the second element directly or indirectly through a conductive region. For example, the first or/and second elements are not restrictive to embodied descriptions herein in terminology, but may be used for illustrating transistors, impurity regions, or various kinds of conductive interconnections.

In the description, for example, a sentence 'transistor is operationally coupled with photodiode' may represent that an impurity region of a photodiode acts as a source or drain region of a transistor, an impurity region of a photodiode is electrically connected to the source or drain region of the transistor, or an impurity region of a photodiode is electrically connected to a gate of the transistor.

In the description, for example, a sentence 'first and second transistors are operationally coupled with each other' may be understood such that a voltage applied to a gate of the first transistor is transferred to a terminal or node of the second transistor, e.g., a gate, a source region, or a drain region, directly or indirectly through a third transistor or a conductor such a metal interconnection. Alternatively, it may indicate that a terminal or node of the first transistor is electrically connected with a terminal or node of the second transistor.

In the specification herein, 'semiconductor substrate', 'semiconductor layer', 'semiconductor pattern', or 'substrate' will be used to represent a structure based on a semiconductor. This structure based on semiconductor may be comprised of a silicon layer, a silicon-on-insulator (SOI) where a silicon layer is disposed on an insulation layer, a doped or undoped silicon layer, an epitaxial layer formed by a technique of epitaxial growth, or another semiconductor construction.

While the exemplary embodiments of the present invention are applicable to all kinds of image sensors, the embodied description herein will be illustrative a CMOS image sensor as an example for appreciation of the features by the invention.

BRIEF DESCRIPTION OF THE FIGURES

The accompanying figures are included to provide a further understanding of the invention, and are incorporated in and constitute a part of this specification. The drawings illustrate exemplary embodiments of the invention and, together with the description, serve to explain principles of the present invention. In the figures.

DETAILED DESCRIPTION OF PREFERRED EMBODIMENTS

Figure 3:
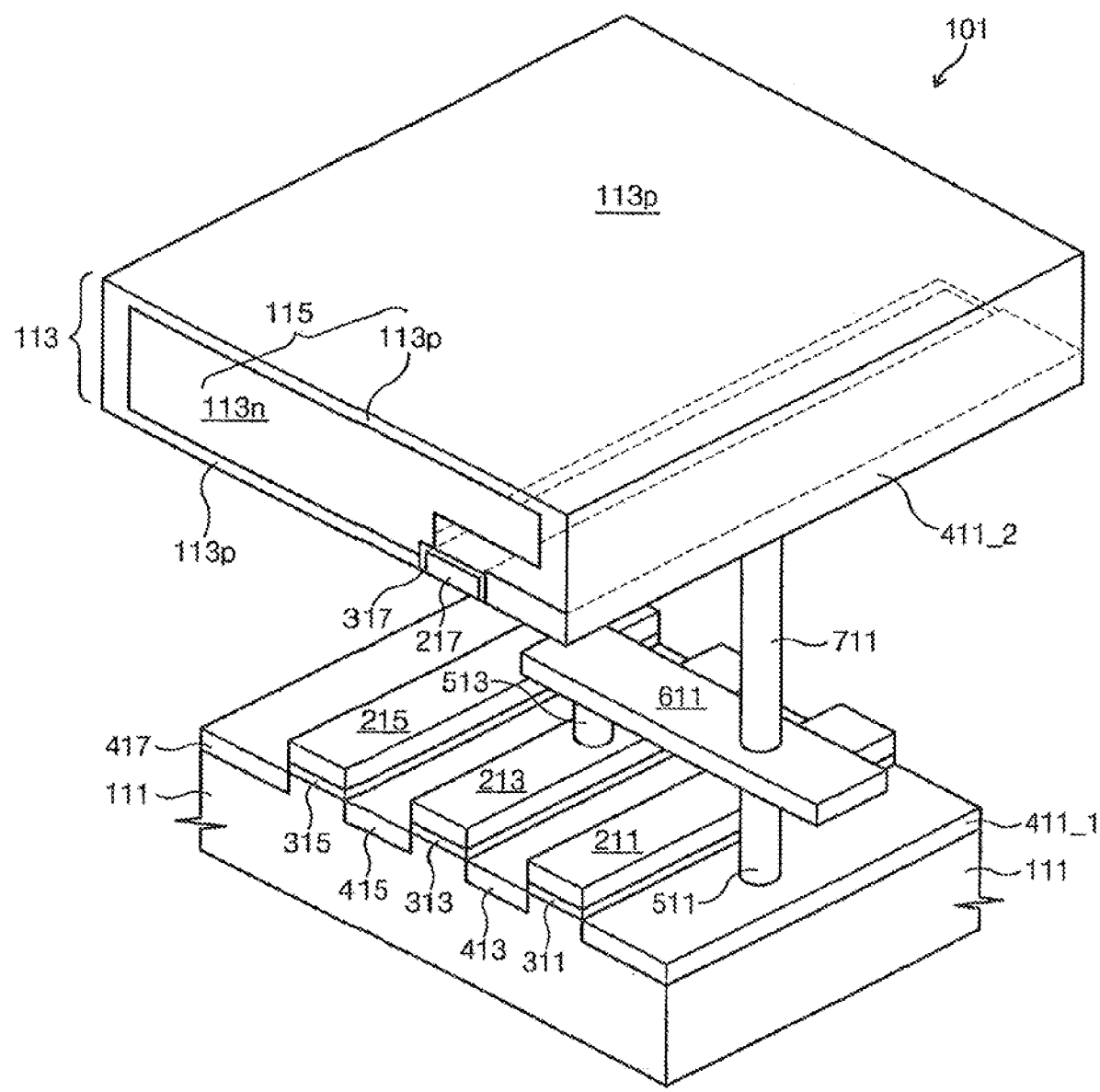
FIG. 3 is a perspective view of a pixel in an image sensor in accordance with an embodiment of the present invention.

FIG. 3 is a perspective view of a pixel in an image sensor in accordance with an embodiment of the invention. Referring to FIG. 3, a pixel 101 according to the embodiment by the invention comprises a photodiode 115, and transfer, reset, source follower, and selection transistors operationally coupled with the photodiode 115. According to this embodiment of the invention, the components of the pixel 101 are arranged in separate first and second semiconductor patterns 111 and 113 that are spaced apart from each other. In this exemplary embodiment of the invention, the photodiode 115 and the transfer transistor are disposed in the second semiconductor pattern 113, while the reset, source follower, and selection transistors are placed in the first semiconductor pattern 111. The gate 217 of the transfer transistor is disposed under the photodiode 115. Thus, the fill factor of the pixel is not affected by the presence or size of the transfer, reset, source follower, and selection transistors therein.

According to this embodiment, as the second semiconductor pattern 113 is used entirely for the photodiode 115, it is possible to achieve the fill factor of substantially 100%.

In this embodiment, since the first semiconductor pattern 111 including the transistors does not affect the fill factor, the first semiconductor pattern 111 may be formed in the same size as the second semiconductor pattern 113. Thus, it is possible to improve the noise characteristic of 1/f and the light-gathering performance (e.g., speed) of the pixel. In addition, the charge collection regions 411_1 and 411_2, may be enlarged to extend the dynamic range thereof.

The photodiode 115 includes a first conductive region (e.g., an N-type region) 113n formed in the second semiconductor pattern 113 and a second conductive region (e.g., a P-type region) 113p enveloping the first conductive region 113n. In this embodiment, electron-hole pairs as signal charges are generated in response to photons incident upon the second semiconductor pattern 113, and electrons are accumulated in the N-type region 113n. Since the N-type region 113n is entirely enclosed (enveloped) by the P-type region 113p, the leakage of electrons out of the N-type region 113n is minimized.

The transfer gate 217 is disposed under a gate insulation layer 317 adjacent to the N-type region 113n, interposed between the gate insulation layer 317 and the N-type region 113n. It can be seen that the transfer transistor includes the transfer gate 217, and that the second charge collection region 411_2 and the N-type region 113n are positioned at either side of the transfer gate 217. If a bias voltage is applied to turn ON the transfer gate 217, the charges (e.g., electrons) accumulated in the N-type region 113n are transferred to the second charge collection region 411_2 functioning as a floating diffusion region. The second charge collection region 411_2 is formed in the second semiconductor pattern 113 outside of the transfer gate 217, being doped with N-type impurities.

On the first semiconductor pattern 111, a reset gate 211, a source follower gate 213, and a selection gate 215 are formed on gate insulation layers 311, 313, and 315 formed on the first semiconductor pattern 111. Impurity regions in the first semiconductor pattern 111, are source/drain regions. The gate and the impurity regions at either side of a gate constitute a transistor. For instance, a reset transistor includes the reset gate 211 and the impurity regions 411_1 and 413 at either side of the reset gate 211. A source follower transistor includes the source follower gate 213 and the impurity regions 413 and 415 at either side of the source follower gate 213. A selection transistor includes the selection gate 215 and the impurity regions 415 and 417 at either side of the selection gate 215. A VDD voltage (from a power supply not shown) is applied to the impurity region 413 between the reset and source follower gates 211 and 213.

The impurity region 411_1 of the reset transistor is electrically connected to the second charge collection region 411_2, acting as a floating diffusion region (similar to the second charge collection region 411_2). In other words, the impurity region 411_1 of the reset transistor accumulates charges transferred from the photodiode 115 (which hereinafter will be referred to as the first charge collection region in recognition of the fact that signal charges are first accumulated therein). When a bias voltage is applied to the reset gate 211, a conductive channel is formed under the reset gate 211 in the first semiconductor pattern 111 and signal charges remaining in the first and second charge collection regions 411_1 and 411_2 flow into a power source (not shown) connected to the impurity region 413 of the reset transistor. The pixel is thereby initialized.

The source follower gate 213 (of the source follower transistor) is electrically connected to the first and second charge collection regions 411_1 and 411_2. The first and second charge collection regions, 411_1 and 411_2, and the source follower gate 213 are electrically connected with each other by way of a local conductive pattern 611 and contact plugs 511, 513, and 711, forming a common node. Thus, a signal voltage, corresponding to (e.g., proportionate with) the amount of signal charges accumulated in the first and second charge collection regions 411_1 and 411_2, appears at the impurity region 415 of the source follower transistor. When a bias voltage is applied to the selection gate 215 of the selection transistor, the signal voltage (at the impurity region 415) is transferred to an output terminal of the selection transistor, i.e., to the impurity region 417. The signal transferred to the output terminal 417 of the selection transistor is detected and processed by a peripheral circuit (not shown). The signal processing operations performed by peripheral circuits are well known to persons skilled in the art and will be described with reference to FIG. 6 below.

The first semiconductor pattern 111, including the reset, source follower, and selection transistors, may be a P-type silicon semiconductor substrate. The transistors formed in the first semiconductor pattern 111 may be formed by, for example, depositing and patterning each of a gate insulation layer and a conductive layer, and implanting ionic impurities to form the impurity regions. A conductive layer for the gate is not restricted to this exemplary embodiment and may be formed of other materials or in other structures, for example, polysilicon, or a multi-layer of polysilicon and silicide. When the first semiconductor pattern 111 is a P-type, N-type ionic impurities are injected to form source/drain regions of the transistors.

An interlayer insulating layer (911, see FIG. 5, not shown in FIG. 3) is interposed between the first and second semiconductor patterns 111 and 113, as will be detailed with reference to FIG. 5.

The transfer gate 217 may be formed by depositing a conductive layer on the interlayer insulating layer (911 shown in FIG. 5) and patterning the conductive layer. Patterning of the conductive layer may be conducted by a photolithography process. The gate insulation layer 317 covering (insulating) the transfer gate 217 may be formed by a film deposition technique. The second semiconductor pattern 113 disposed on the second interlayer insulating layer (813 shown in FIG. 5), covering the transfer gate 217 and the gate insulation layer 317 thereon, may be formed by means of a film deposition technique such as chemical vapor deposition (CVD) or plasma-enhanced CVD, or epitaxial growth, the methods of formation not being restricted to those examples.

The photodiode 115 may be formed by conducting ion implantation into the second semiconductor pattern 113. For instance, the photodiode 115 may be produced (after forming the second semiconductor pattern 113 doped with P-type impurities), by implanting ionic impurities to form the N-type region 113n and implanting ionic impurities to form the top P-type region 113p. According to this embodiment, the photodiode 113 constitutes a vertical PNP structure, thereby avoiding the effect of image lag.

The second charge collection region 412_2 acting as the floating diffusion region may be formed by implanting ionic impurities into the second semiconductor pattern 113 and using the transfer gate 217 as an ion injection mask.

The steps of ion implantation for the photodiode 115 and the second charge collection region 411_2 may proceed in an appropriate order.

Figure 5:
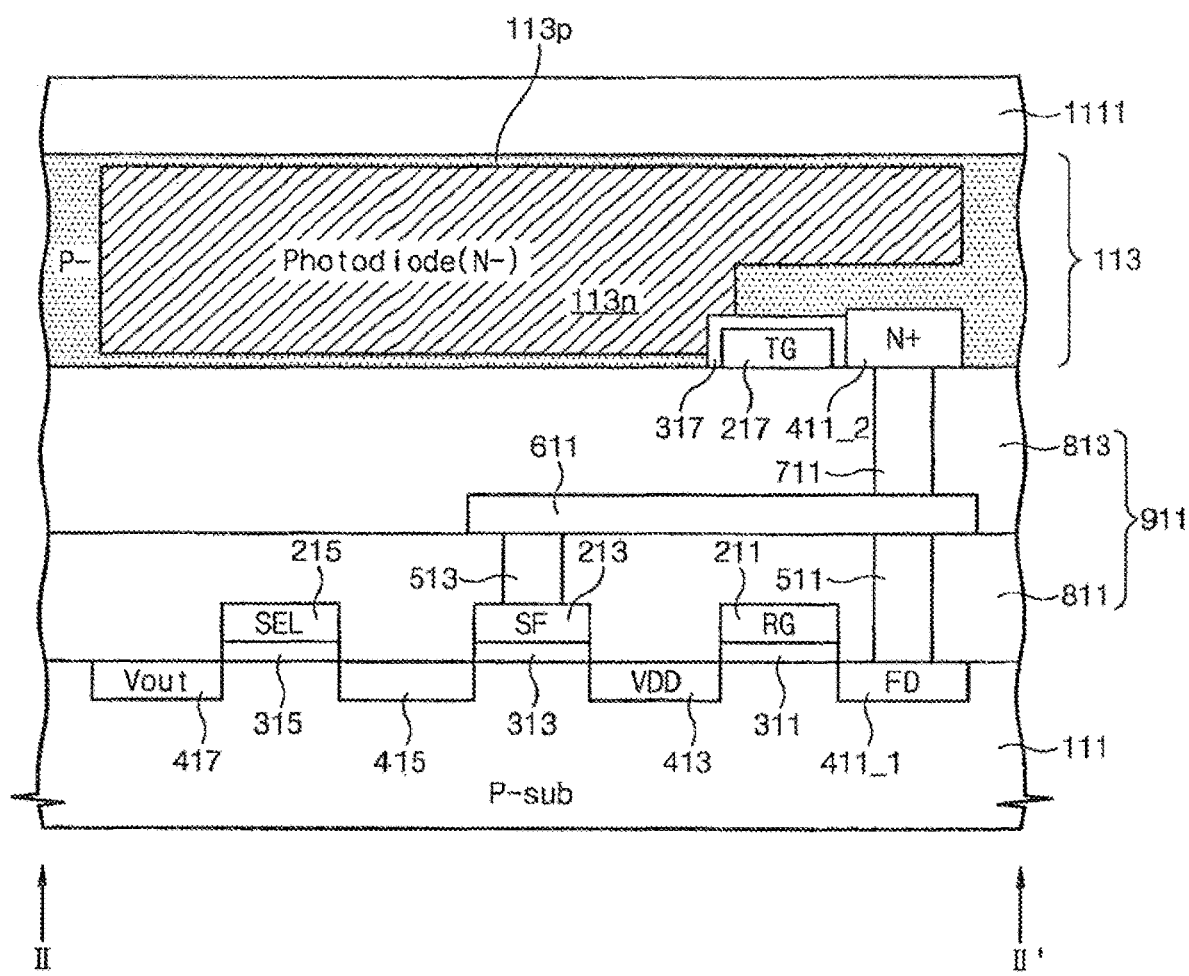
FIG. 5 is a cross-sectional view of a pixel taken along section line II-II' of FIG. 4.

The contact plugs, 511, 513, and 517, may be formed by patterning the interlayer insulating layer(s) (811, 813 as shown in FIG. 5) to form contact holes and then filling the contact holes with a conductive material. The local conductive pattern 611 is may be formed by depositing and patterning a conductive layer (upon interlayer insulating layer 811). The contact plugs 511 and 513 connected each to the first charge collection region 411_1 and the source follower gate 213 may be formed at the same time through the interlayer insulating layer 811.

Interconnections not shown are disposed between the first and second semiconductor patterns 111 and 113 in order to apply bias voltages to the reset gate 211, the selection gate 215, and the transfer gate 217. The interconnections not shown may be formed while forming the local conductive pattern 611.

While forming the contact plugs 511 and 513 connected to the first charge collection region 411_1 and the source follower gate 213 respectively, a contact plug (not shown) connected to the selection gate 215 may be formed at the same time. And, at the same time that the contact plug 711 is formed to connect the local conductive pattern 611 with the second charge collection region 411_2, a contact plug (not shown) for connecting the transfer gate 217 with an interconnection that conducts a bias voltage to the transfer gate 217 may be also be formed.

A processing sequence for forming the contact plugs, the interconnections, and the local conductive pattern may be varied in alternative modes. According to this embodiment, as the interconnections for applying bias voltage to the plural gates are formed under the photodiode 115, it is possible to secure misalignment margins for the interconnections, providing flexibility in arranging the interconnections.

In this exemplary embodiment, a color filter may be disposed over the photodiode, so to minimizes optical and electrical cross-talk therein. In addition, since the photodiode is very close to or contacts with the color filter and has a large fill-factor, it may not require a micro-lens for condensing light.

A light shielding pattern can be formed under the photodiode without degrading the fill factor of the pixel, and it is possible to minimize electrical interference more effectively.

The photodiode may be formed after completing almost all of metal interconnections. Thus, since there is no metal contact on the photodiode, a dark level thereof can be minimized.

Figure 4:
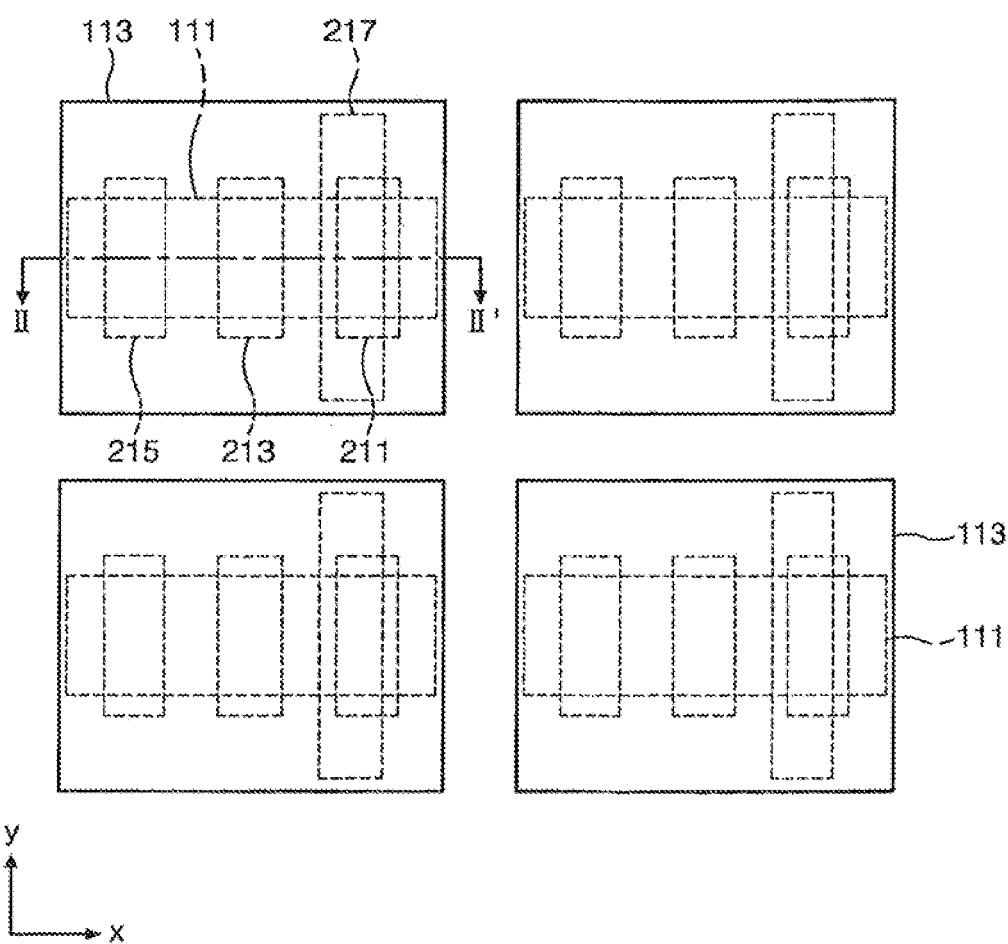
FIG. 4 is a plane view of a portion of a pixel array of the image sensor of FIG. 3.

FIG. 4 is a plane view illustrating part of the pixel array of the image sensor of FIG. 3, and FIG. 5 is a cross-sectional view of a pixel in the array of FIG. 4 taken along section line II-II' in FIG. 4.

Referring to FIG. 4, the first semiconductor pattern 111, including the reset gate 211, the source follower gate 213, and the selection gate 215, is located under the second semiconductor pattern 113 and is entirely covered by the second semiconductor pattern 113. Therefore, the dimensions of the pixel are determined by the size of the second semiconductor pattern 113 including the photodiode 115. The second semiconductor pattern 113 can be used entirely as the photodiode 115. As illustrated in FIG. 4, a gate width (or the width of the active region) can be enlarged in by extension of the first semiconductor pattern 111 along the y axis, by which enlarged width the performance of transistor becomes improved. The width of the first semiconductor pattern 111 may be extended so as to make the first semiconductor pattern 111 the same size as the second semiconductor pattern 113. Further, since the first semiconductor pattern 111 is disposed under the second semiconductor pattern 113 including the photodiode 115, it is permissible to variously modify the configuration of the first semiconductor pattern 111 without reducing the fill factor. For instance, upon altering the configuration of the first semiconductor pattern 111 in various ways, it is possible to design channel patterns suitable for the optimum performance of the transistors without reducing the fill factor.

In addition, because the transfer gate 127 is disposed under the photodiode 115, the gate length of the transfer gate 127 may be variously designed for the optimum transfer efficiency.

A cross-section of the pixel of FIG. 3 and FIG. 4 can be seen from FIG. 5. In FIG. 5, the reference numerals 811 and 813 denote first and second interlayer insulating layers and are collectively referred to by the reference numeral 911. The reference numeral 1111 indicates a color filter. The first and second interlayer insulating layers 811 and 813 may be formed of, for example, borophospho-silicate glass (BPSG) doped with boron (B) and phosphorous (P), boro-silicate glass (BSG) doped with boron, phosphor-silicate glass (PSG) doped with phosphorous, undoped silicate glass (USG), or vapor-deposited silicon oxide. The color filter may be formed by a conventional process.

Figure 1:
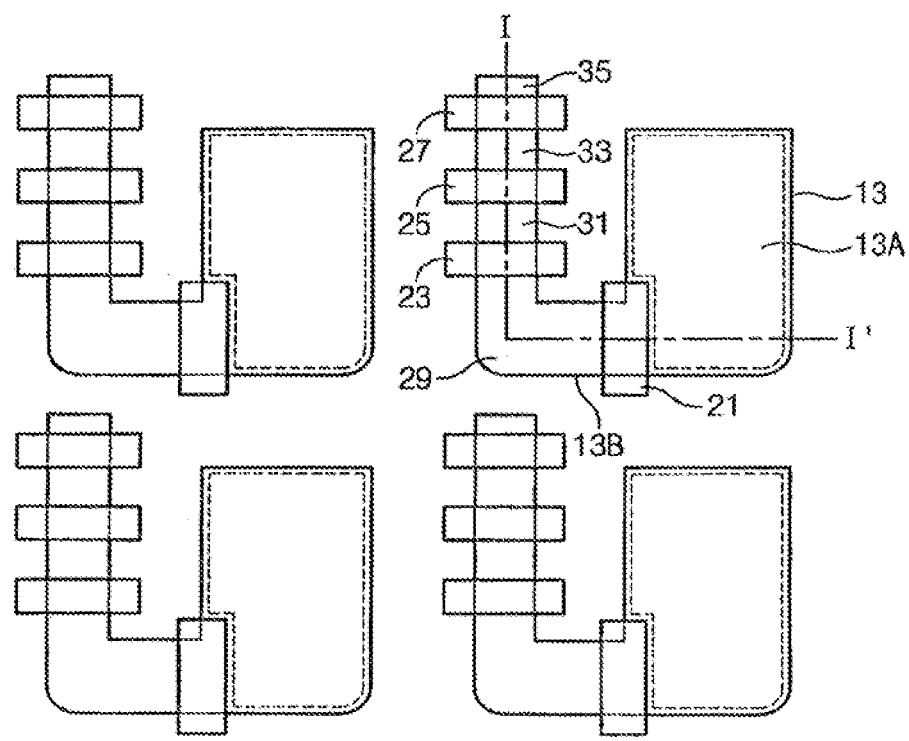
FIG. 1 is a plane view of a portion of a pixel array of a typical image sensor.
Figure 2:
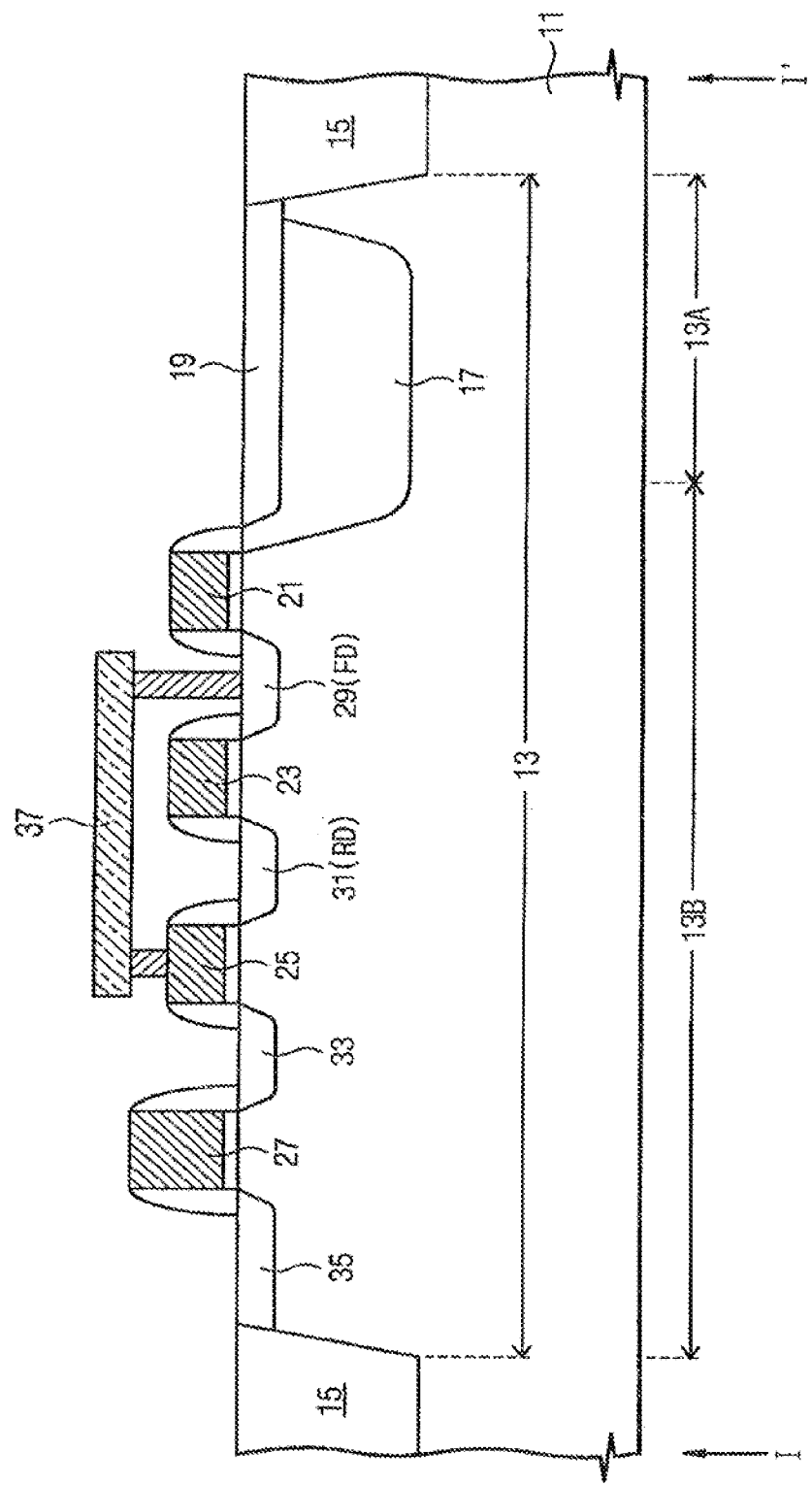
FIG. 2 is a cross-sectional view of a pixel taken along section line I-I' of FIG. 1.

Referring to FIG. 5, the color filter 1111 is arranged close or in direct contact with the top of the photodiode 115. In the conventional image sensor shown in FIG. 1 or 2, because various kinds of interconnections are arranged over the photodiode, the color filter is inevitably spaced apart from (above) the photodiode. And the conventional image sensor uses microlenses to raise the efficiency of light sensing. Further, due to the distance between the color filter and the photodiode in the conventional image sensor, the light passing through the color filter may arrive at an adjacent pixel as well as a target pixel. In exemplary embodiments of the present invention, since the color filter 1111 is disposed close to or in direct contact with the photodiode 115, light passing through the color filter is entirely incident on the photodiode 115 in substance. Moreover, because, in exemplary embodiments of the invention, the photodiode is located directly under the color filter, a microlens need not be formed in the pixel.

Figure 6:
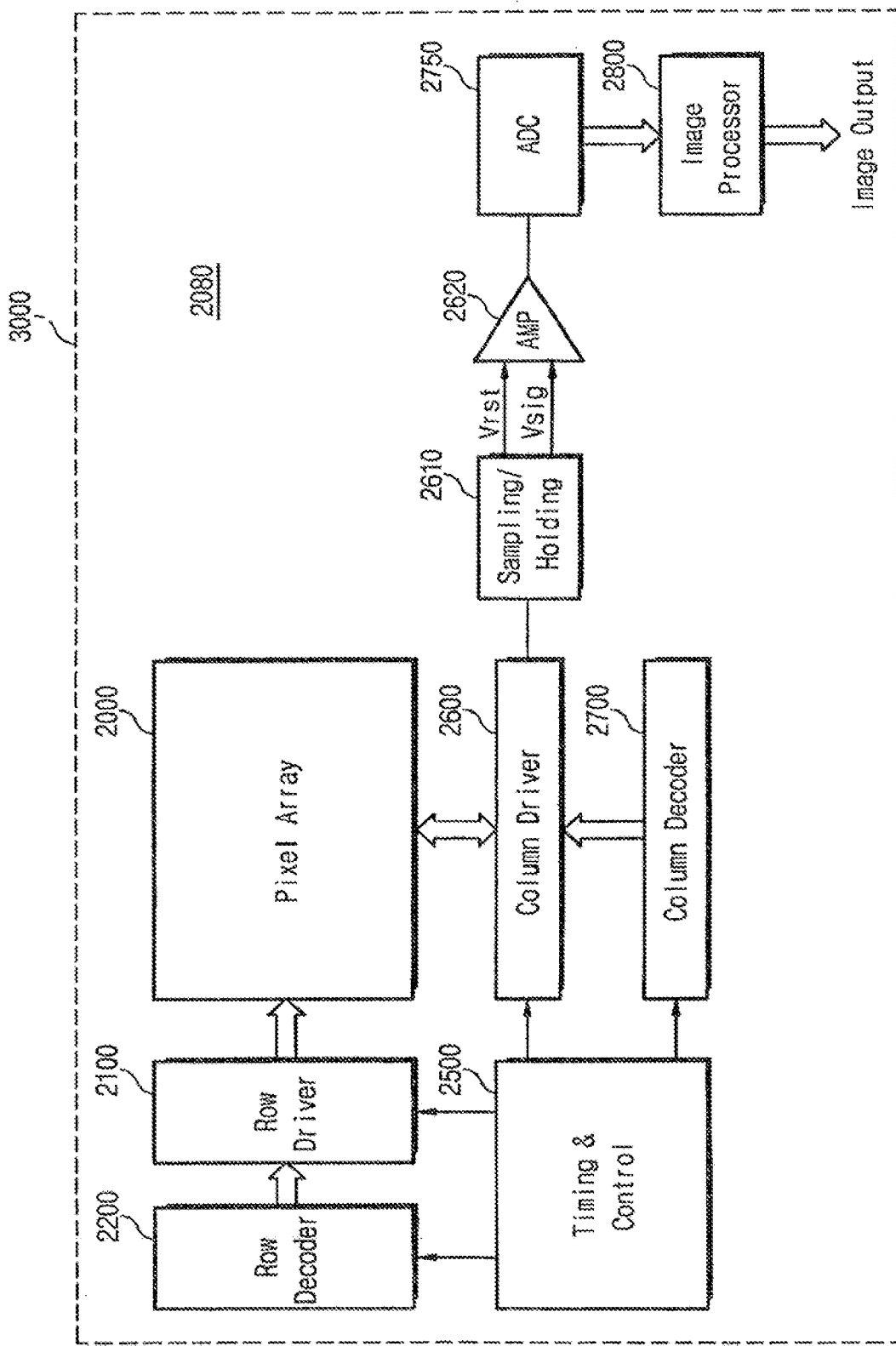
FIG. 6 is a block diagram of the image sensor including the pixels of FIGS. 3, 4 and 5.

FIG. 6 is a block diagram of the image sensor 2080 including the pixel of FIGS. 3, 4 and 5. Referring to FIG. 6, the pixel array 2000 includes a plurality of pixels arranged in a matrix. The matrix of the pixel array 2000 includes rows and columns of pixels. A row driver 2100 selects a specific row of pixels in the pixel array 2000 in response to an output of a row decoder 2200, and a column driver 2600 selects a specific column of pixels in the pixel array 2000 in response to an output of a column decoder 2700. The CMOS image sensor is controlled by a controller 2500. The controller 2500 controls the row decoder 2200, the row driver 2100, the column decoder 2700, and the column driver 2600.

An output signals from each of the pixels include a pixel reset signal Vrst and a pixel image signal Vsig. The pixel reset signal Vrst corresponds with the potential of the charge collection region when the pixel is in a reset state. The pixel image signal Vsig corresponds with the potential of the charge collection region after signal charges generated from an image have been transferred to the charge collection region. The pixel reset signal Vrst and the pixel image signal Vsig are read out by a sampling/holding circuit 2610. An amplifier (AMP) 2620 generates a difference signal Vrst−Vsig from the reset and image signals Vrst and Vsig. The difference signal is transformed into a digital signal by an analog-digital converter (ADC) 2750. An image processor 2800 generates a digital image from the digitized differential signals. The image sensor 2080 may be included in a semiconductor chip (e.g., a wafer 3000).

Figure 7:
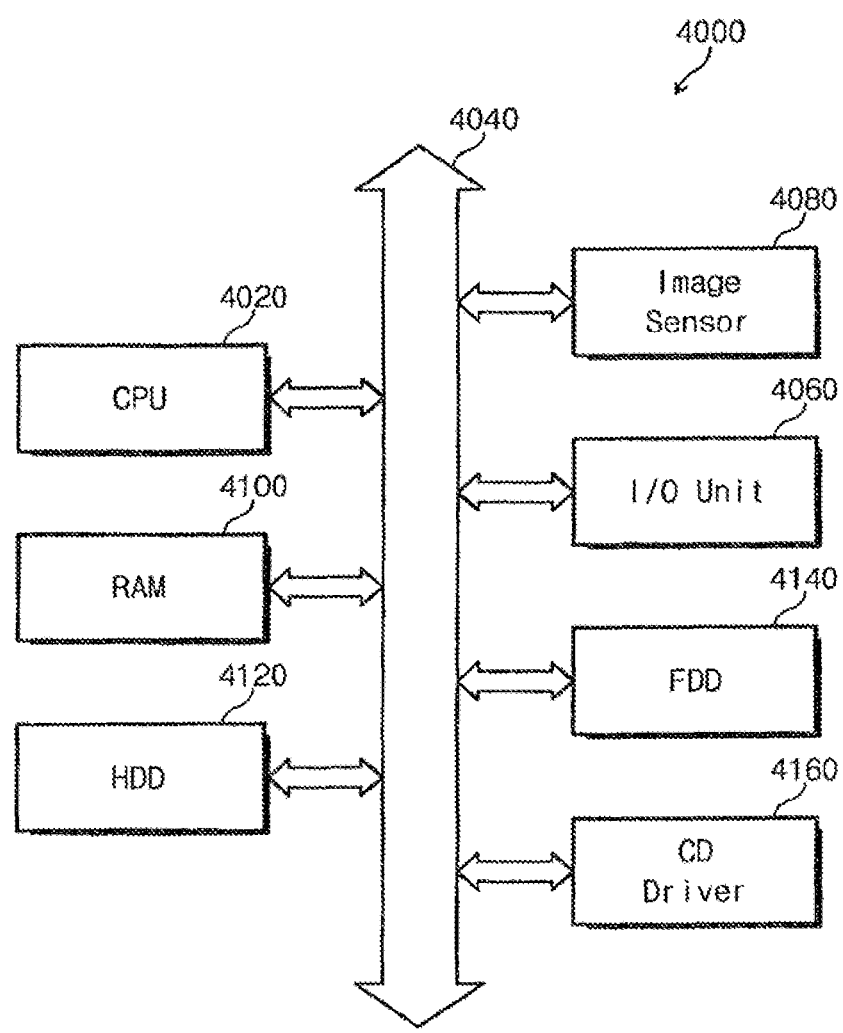
FIG. 7 is a block diagram of a system with the image sensor shown in FIG. 6.

FIG. 7 is a block diagram of a processor-based system 4000 including the image sensor of FIG. 6. The processor-based system 400 may be, any digital circuit that may employ the image sensor 4080. The processor-based system is not limited hereto, but may be a computer system, a camera system, a cell-phone, a scanner, a videophone, a surveillance system, a machine vision system, a vehicle navigation system, an automatic focus system, a star tracking system, a motion detection system, an image stabilization system, a data compression system, or other system compatible with an image sensor.

The system 4000 includes a processor (e.g., central processor unit, CPU) 4020 communicating with plural devices or peripherals via a bus 4040. The devices (peripherals) coupled to bus 4040, are e.g., an input/output unit 4060 and the image sensor 4080, provide the system 4000 with input/output communication. The devices coupled to bus 4040, include at least one peripheral memories, such as a RAM 4100, a hard disc driver (HDD) 4120, a floppy disc driver (FDD) 4140, and a compact disc (CD) driver 4160. The image sensor 4080 receives control signals as data from the processor 4020 or from another device of the system 4000. The image sensor 4080 provides the processor 402 with a data signal defining an image on basis of the received control signals or data, and the processor 4020 processes the signal supplied from the image sensor 4080.

Accordingly in exemplary embodiments of the invention, a fill factor of substantially 100% can be attained because the second semiconductor pattern 113 is used entirely for the photodiode.

In exemplary embodiments of the invention, (see FIGS. 3, 4, 5) the first semiconductor pattern 111 including the transistors does not affect the fill factor, and may be formed at the same size (area) as the second semiconductor pattern 113. Thus, it is possible to improve the noise characteristic of 1/f and also the performance of light-sensing operations. In addition, exemplary embodiments of the invention facilitate enlargement of charge collection regions 411_1 and 411_2, to extend dynamic range.

In exemplary embodiments of the invention, the photodiode 113 constitutes a vertical PNP structure that avoids an effect of image lag. Image lag occurs in conventional image sensors when traces of a previous frame (image) remain in future frames, i.e. when the pixel is not fully reset.

In exemplary embodiments of the invention, since the first semiconductor pattern 111 is disposed under the second semiconductor pattern 113 including the photodiode 115, it is permissible to variously modify the configuration of the first semiconductor pattern 111 without reducing the fill factor. For instance, by altering the configuration of the first semiconductor pattern 111 in various forms, it is possible to design channel patterns suitable for the optimum performance of the transistors.

In exemplary embodiments of the invention, since the color filter is disposed close to or directly contacting the photodiode, light passing through the color filter is entirely incident upon the target photodiode.

In exemplary embodiments of the invention, since the photodiode is located directly under the color filter, the microlens provided in conventional image sensors may be omitted entirely.

In exemplary embodiments of the invention, forming a light shielding pattern under the photodiode does not degrade the fill factor of the pixel, and it is possible to minimize electrical interference more effectively.

In this embodiment, the photodiode is formed after formation of almost all of the metal interconnections. Thus, since there is no metal contact on the photodiode, it is able to minimize a dark level thereof.

The above-disclosed subject matter is to be considered illustrative, and not limiting, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An image sensor comprising:
    a first semiconductor substrate including a first surface and a second surface, at least one transistor formed on the first surface of the first semiconductor substrate;
    a first insulating layer stacked on the at least one transistor;
    a second semiconductor substrate having a first surface and a second surface,
    a photodiode formed in the second semiconductor substrate;
    a transfer gate pattern and a floating diffusion region of a transfer transistor formed on the first surface of the second semiconductor substrate;
    a second insulating layer disposed between the first surface of the second semiconductor substrate and the first insulating layer;
    wherein the first surface of the first semiconductor substrate and the first surface of the second semiconductor substrate face each other, and the first and second insulating layers are interposed between the first and second semiconductor substrates.

2. The image sensor of claim 1, wherein the at least one transistor includes a source follower transistor connected to the floating diffusion region through at least one contact plug penetrating the first and second insulating layers.

3. The image sensor of claim 2, wherein the at least one contact plug includes a first contact plug formed in the first insulating layer and a second contact plug formed in the second insulating layer.

4. The image sensor of claim 3, further comprising:
    a conductive pattern formed between the first contact plug and the second contact plug,
    wherein the conductive pattern is disposed at an interface between the first insulating layer and the second insulating layer.

5. The image sensor of claim 4, wherein the source follower transistor, the first contact plug, the second contact plug, and the conductive pattern are disposed below the photodiode in a sectional view.

6. The image sensor of claim 4, wherein the at least one transistor further includes a reset transistor connected to the floating diffusion region through a third contact plug.

7. The image sensor of claim 6, wherein the first contact plug and the third contact plug are electrically connected to each other and formed in the first insulating layer, wherein the first contact plug and the third contact plug are formed simultaneously.

8. The image sensor of claim 3, wherein the source follower transistor and the first and second contact plugs are disposed below the photodiode in a sectional view.

9. The image sensor of claim 3, wherein the source follower transistor and the first and second contact plugs are disposed below the photodiode.

10. The image sensor of claim 2, wherein the at least one transistor further includes a selection transistor connected to the source follower transistor and outputs a signal voltage originated from the photodiode.

11. The image sensor of claim 10, wherein the first semiconductor substrate further includes a peripheral circuit to process the signal voltage.

12. An image sensor comprising:
    a first semiconductor substrate including a first surface and a second surface, at least one transistor formed on the first surface of the first semiconductor substrate;

a first insulating layer stacked on the at least one transistor;
a second semiconductor substrate having a first surface and a second surface,
a photodiode formed in the second semiconductor substrate;
a transfer gate pattern and a floating diffusion region of a transfer transistor formed on the first surface of the second semiconductor substrate;
a second insulating layer disposed between the first surface of the second semiconductor substrate and the first insulating layer;
wherein the first surface of the first semiconductor substrate and the first surface of the second semiconductor substrate face each other, and the first and second insulating layers are interposed between the first and second semiconductor substrates,
wherein the transfer gate pattern of the transfer transistor is disposed below the photodiode in a sectional view.

13. The image sensor of claim 12, wherein the floating diffusion region of the transfer transistor is also disposed below the photodiode at a side of the transfer gate pattern.

14. The image sensor of claim 12, wherein the transfer gate is formed in a recess region of the first surface of the second semiconductor substrate.

15. The image sensor of claim 12, wherein the at least one transistor includes a source follower transistor connected to the floating diffusion region through at least one contact plug penetrating the first and second insulating layers.

16. The image sensor of claim 15, wherein the at least one contact plug includes a first contact plug formed in the first insulating layer and a second contact plug formed in the second insulating layer.

17. An image sensor comprising:
a first semiconductor substrate including a first surface and a second surface, at least one transistor formed on the first surface of the first semiconductor substrate;
a first insulating layer stacked on the at least one transistor;
a second semiconductor substrate having a first surface and a second surface,
a photodiode formed in the second semiconductor substrate;
a transfer gate pattern and a floating diffusion region of a transfer transistor formed on the first surface of the second semiconductor substrate;
a second insulating layer disposed between the first surface of the second semiconductor substrate and the first insulating layer;
wherein the first surface of the first semiconductor substrate and the first surface of the second semiconductor substrate face each other, and the first and second insulating layers are interposed between the first and second semiconductor substrates,
wherein at least a part of the transfer gate pattern of the transfer transistor is disposed in the second semiconductor substrate.

18. The image sensor of claim 17, wherein the floating diffusion region of the transfer transistor is also disposed below the photodiode at a side of the transfer gate pattern.

19. The image sensor of claim 17, wherein the at least one transistor includes a source follower transistor connected to the floating diffusion region through a first contact plug and a second contact plug, wherein the first contact plug is in the first insulating layer and the second contact plug is in the second insulating layer.

20. The image sensor of claim 19, further comprising:
a conductive pattern formed between the first contact plug and the second contact plug,
wherein the conductive pattern is disposed at an interface between the first insulating layer and the second insulating layer.

* * * * *